(12) United States Patent  
Schulz

(10) Patent No.: US 7,522,848 B2
(45) Date of Patent: Apr. 21, 2009

(54) RECEIVER WITH DYNAMICALLY ADJUSTABLE DECISION THRESHOLD VOLTAGE BASED ON INPUT POWER

(75) Inventor: Craig Schulz, Fremont, CA (US)

(73) Assignee: EMCORE Corporation, Albuquerque, NM (US)

( * ) Notice: Subject to any disclaimer, the term of this patent is extended or adjusted under 35 U.S.C. 154(b) by 814 days.

(21) Appl. No.: 10/955,575

(22) Filed: Sep. 30, 2004

(65) Prior Publication Data

US 2006/0067711 A1   Mar. 30, 2006

(51) Int. Cl.
*H04B 10/06* (2006.01)
(52) U.S. Cl. .................................... 398/209; 398/210
(58) Field of Classification Search .......... 398/208–211
See application file for complete search history.

(56) References Cited

U.S. PATENT DOCUMENTS 6,359,715 B1 *   3/2002   Imajo .......................... 398/210
6,459,335 B1 *  10/2002   Darmawaskita et al. ........ 330/9
6,665,497 B1 *  12/2003   Hamilton-Gahart et al. . 398/135
7,269,347 B1 *   9/2007   Matricardi et al. ............. 398/24
2003/0067662 A1 *  4/2003   Brewer et al. ................ 359/189
2004/0253003 A1 * 12/2004   Farmer et al. ................ 398/214
2006/0067712 A1 *  3/2006   Draper et al. ................ 398/208

* cited by examiner

*Primary Examiner*—Christina Y Leung
(74) *Attorney, Agent, or Firm*—Blakely Sokoloff Taylor & Zafman LLP

(57) ABSTRACT

According to embodiments of the present invention, an optical transponder and/or optical transceiver includes a decision circuit, which scales a decision threshold voltage based on power in a received optical signal. In one embodiment, the decision set point may be established based on an expected amplitude or power of an incoming optical signal and the transponder and/or transceiver uses the actual power of the incoming optical signal to adjust the decision threshold voltage.

14 Claims, 5 Drawing Sheets

RECEIVER WITH DYNAMICALLY ADJUSTABLE DECISION THRESHOLD VOLTAGE BASED ON INPUT POWER

BACKGROUND

1. Field

Embodiments of the present invention relate to telecommunication equipment and, in particular, to receivers.

2. Discussion of Related Art

Receivers may be used in telecommunication systems and/or networks to receive data and/or other information on optical and/or electrical signals. Traditional receivers have limitations, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
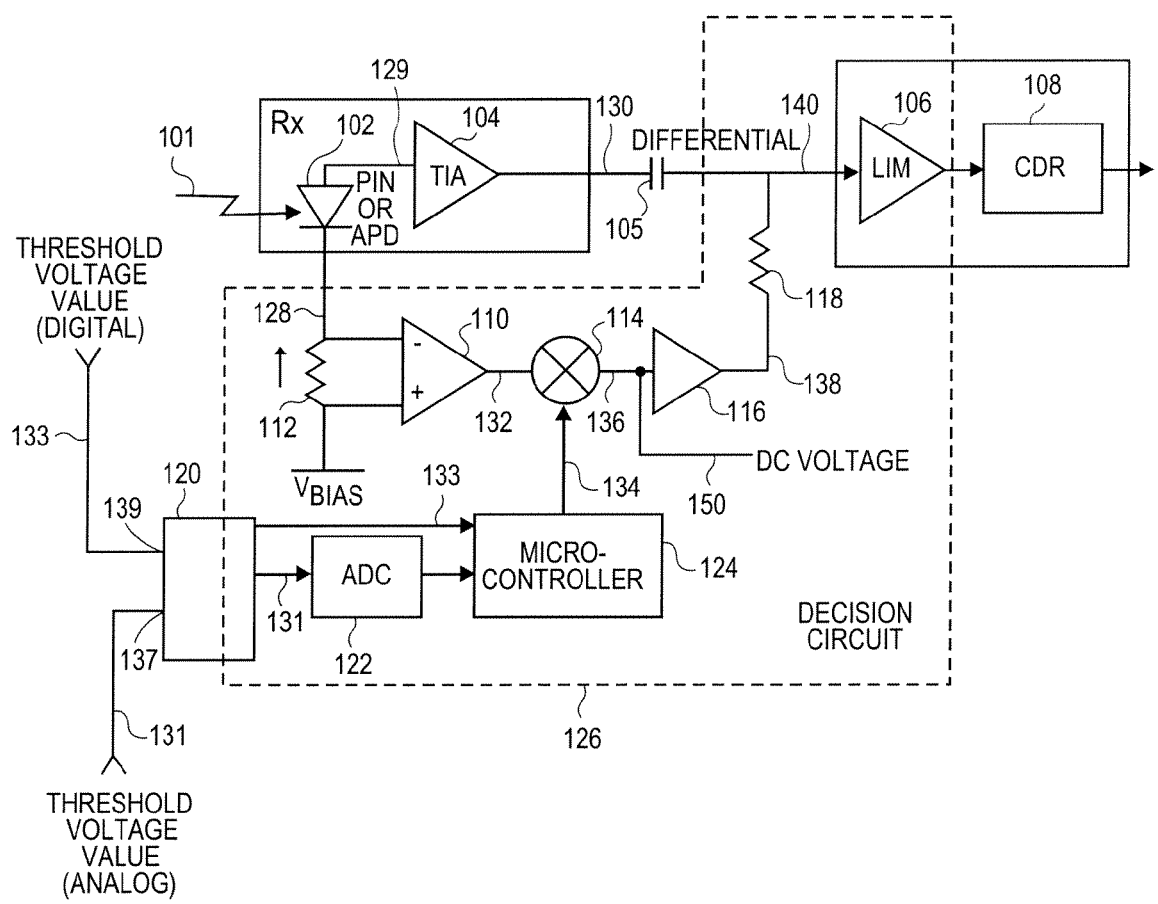
FIG. 1 is a schematic diagram of a receiver according to an embodiment of the present invention.

FIG. 1 is a schematic diagram of a receiver 100 according to an embodiment of the present invention. In the illustrated embodiment, the receiver 100 receives an optical signal 101 having a data stream thereon at a photodetector 102, such as an avalanche photodiode or a positive-intrinsic-negative (PIN) diode, for example. The photodetector 102 is coupled to a transimpedance amplifier 104 (TIA 104), which is coupled to a decision amplifier 106, such as a limiting amplifier, for example, via a capacitor 105, such as a 0.1 pF capacitor, for example. The example decision amplifier 106 is coupled to a clock and data recovery (CDR) circuit 108.

In the illustrated embodiment, the photodetector 102 also is coupled to a current sense circuit, such as a difference amplifier or differential amplifier 110, via a resistor 112. The illustrated differential amplifier 110 is coupled to a multiplier 114, which is coupled to a level-shifting amplifier 116 (level shifter 116). The illustrated level shifter 116 is coupled to the decision amplifier 106 through a resistor 118. In the illustrated embodiment, a connector 120 such as a 300-pin multisource agreement (MSA) connector, an XFP connector, a XENPAK connector, or other suitable connector, for example, is coupled to an analog-to-digital converter 122 (ADC 122), such as an ADC with twelve-bit resolution, for example. The ADC 122 is coupled to a microcontroller 124, such as a precision mixed signal microcontroller, for example, is coupled to the multiplier 114 via a serial communication port.

An analog threshold voltage value 131 may be input to the decision circuit 126 through a pin 137 and may be used as a set point to determine whether a data bit on an optical signal is a logical one or a logical zero. Alternatively, a digital threshold value 133 may be input to the decision circuit 126 through one or more pins 139 and may be used as the set point to determine whether a data bit on an optical signal is a logical one or a logical zero.

In one embodiment, the decision amplifier 106, the differential amplifier 110, the resistor 112, the multiplier 114, the level shifter 116, the resistor 118, the ADC 122, and the microcontroller 124 may form a decision circuit 126 which may be used to dynamically adjust and/or scale the threshold voltage 140 based on dynamic variations in the incoming optical signal 101 power. In alternative embodiments, the decision circuit 126 may be an analog circuit and thus the ADC 122, microcontroller 124 may not be included, and the multiplier 114 may be an analog multiplier. In embodiments, the connector 120 may include a pin 137 to receive the set point 134 represented as an analog voltage 131 and/or one or more pins 139 to receive the set point 134 as a digital representation 133 via a digital serial communication link.

Figure 2:
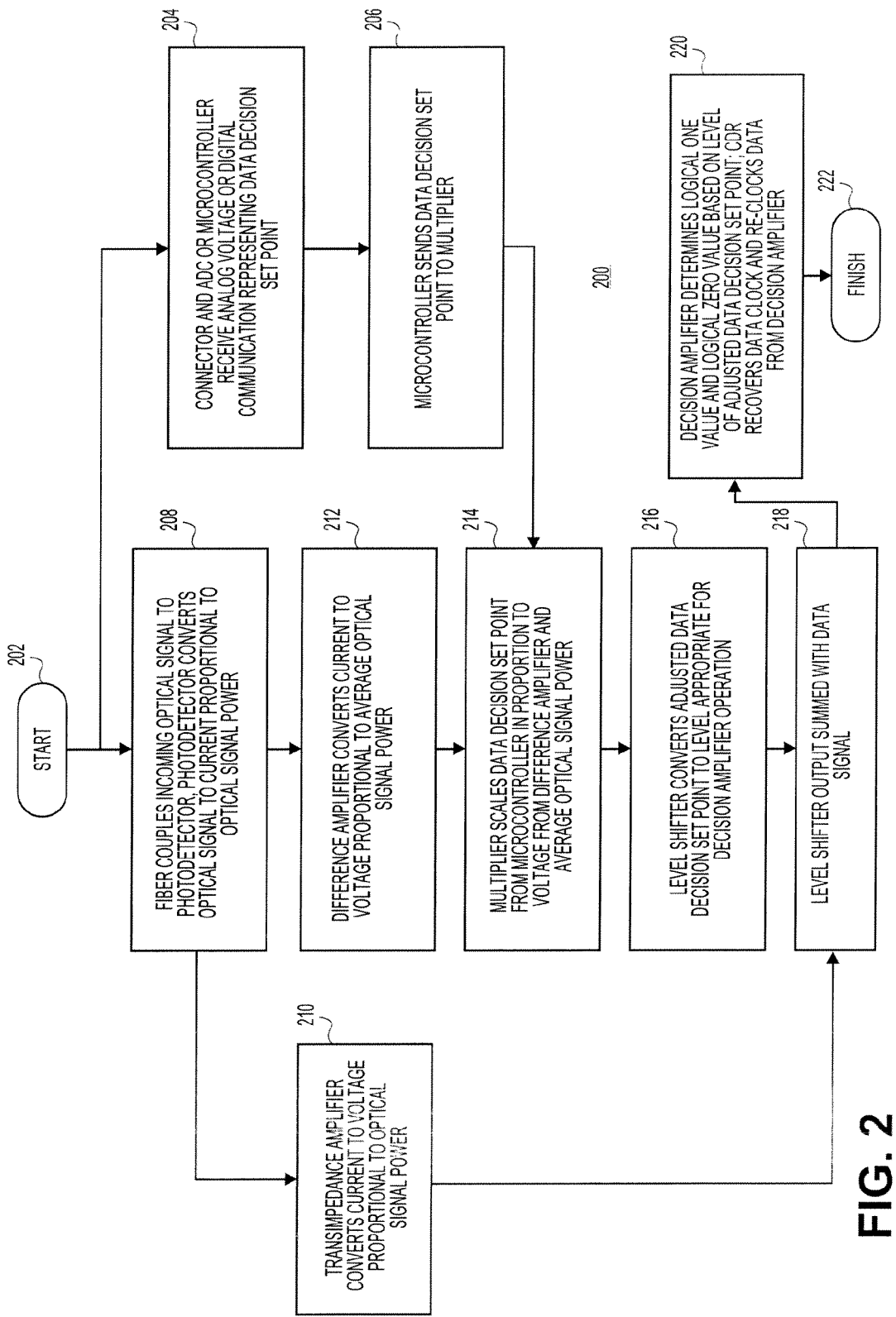
FIG. 2 is a flow chart illustrating an approach to operating a receiver according to an embodiment of the present invention.

FIG. 2 is a flow chart illustrating a process 200 for operating the receiver 100 according to an embodiment of the present invention in which the receiver 100 may dynamically adjust and/or scale the threshold voltage 140 based on the power in the incoming optical signal 101. The process 200 begins with a block 202, where control passes to a block 204.

In the block 204, the ADC 122 may receive an analog voltage 131 representing the threshold set point value 134 via the pin 137 on the connector 120, converts the analog value to a digital value, and couples the digital value to the microcontroller 124. Alternatively, a digital representation 133 of the set point 134 may be coupled to the microcontroller 124 through 120. Alternatively still, the set point 131/133 may be coupled to the mixer 114.

Figure 3:
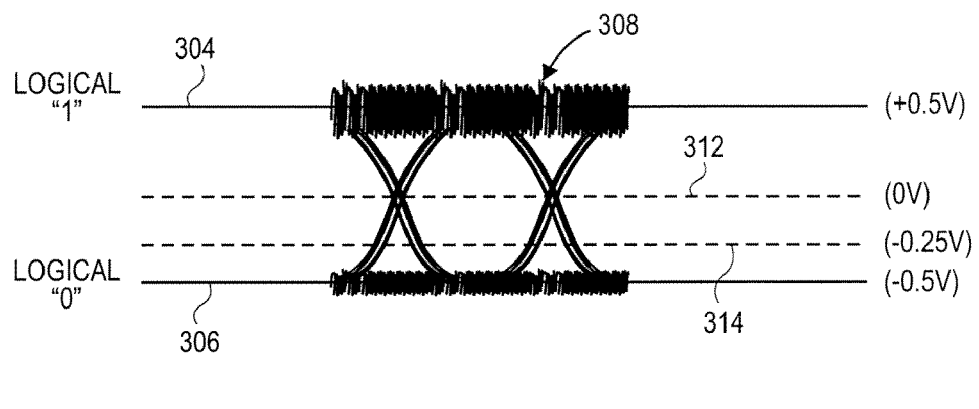
FIG. 3 is a graphical representation (or eye pattern) of a voltage signal according to an embodiment of the present invention.

FIG. 3 is a graphical representation or eye pattern of an initial voltage signal 300 at the input to the decision amplifier 106 according to an embodiment of the present invention. In the illustrated embodiment, the voltage signal has a value of one volt peak-to-peak (1.0Vpp), the eye pattern 300 includes the data bits acquired from the data stream overlaid on top of each other, amplitude 304 is representative of a logic level one, and amplitude 306 representative of a logic level zero. Also in the illustrated embodiment, the expected voltage signal 300 includes noise 308 on the logic level one and noise 310 on the logic level zero.

In one embodiment, the noise 308 and 310 may be optical noise and the amplitude of the noise 308 on the logic level one may be greater than the amplitude of the noise 310 on the logic level zero. In the illustrated embodiment, a threshold voltage value 314 may be set below the midpoint between the logic one and zero levels to reduce the bit error rate of the receiver 100.

In one embodiment, a user may measure the link bit error rate (BER) using forward error correction (FEC) circuitry (not shown) following the CDR 108 and then may modify the set point 134 by modifying the analog voltage 131 and/or digital representation 133 to reduce the BER in the recovered data stream. This may be accomplished at the beginning of life of the receiver 100 or by a user after the receiver 100 has been put into service, for example.

In the illustrated embodiment, the threshold voltage value 314 is −0.25 volts or twenty-five percent (25%) of the expected signal amplitude and zero volts 312 represents fifty percent (50%) of the expected signal amplitude. For example, using the threshold voltage value 314 of 25% of the rail-to-rail input voltage the receiver 100 may determine that if the voltage level is −0.25 volts or greater, then the data bit on the incoming optical signal 101 is a logical one. Alternatively, the receiver 100 may determine that if the voltage level is less than −0.25 volts, then the data bit on the incoming optical signal 101 is a logical zero.

Referring back to FIG. 2, in a block 206, the microcontroller 124 may receive the analog voltage 131 and/or digital representation 133 of the set point and couples the set point 134 to the multiplier 114, via a serial communication port, for example.

In a block 208, an optical fiber (not shown) may couple an optical signal to the photodetector 102, which may convert the optical signal 101 to a current 128/129 proportional to power of the optical signal 101.

In a block 210, the TIA 104 may receive the current 129 and convert it to a voltage signal proportional to the current 129 and the power of the optical signal 101. The output of the TIA 104 may be a differential voltage signal 130 coupled to the decision amplifier 106 via the capacitor 105. The capacitor 105 may ensure that the decision amplifier 106 and the level shifter 116 do not interfere with the direct current (DC) operating point of the TIA 104.

Figure 4:
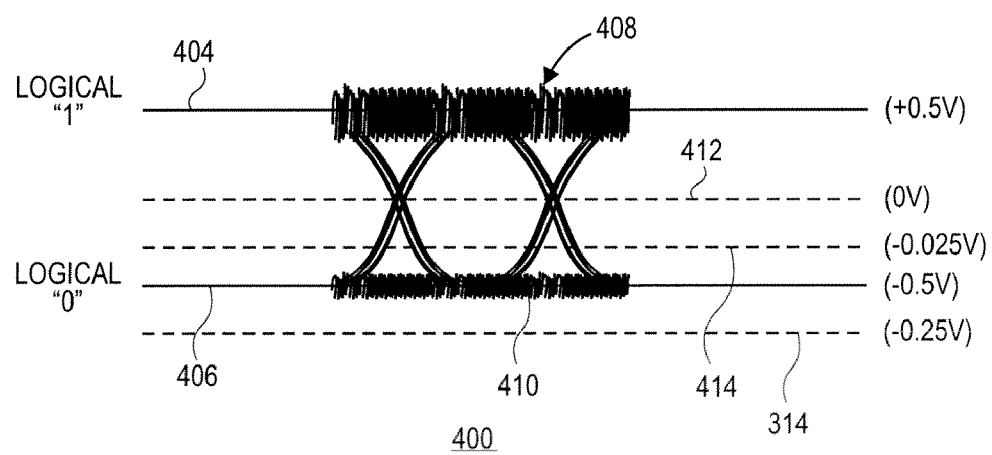
FIG. 4 is a graphical representation (or eye pattern) of a voltage signal according to an alternative embodiment of the present invention.

FIG. 4 is a graphical representation of an eye pattern representing a subsequently received voltage signal 400 at the input of the decision amplifier 106 from which a threshold voltage value 414 is produced according to an embodiment of the present invention. In the illustrated embodiment, the voltage signal 400 has a value of 0.1 volts peak-to-peak (0.1Vpp), the eye pattern of the voltage signal 400 includes the data bits acquired from the data stream in the incoming optical signal 101 overlaid on top of each other, amplitude 404 is representative of a logic level one, and amplitude 406 representative of a logic level zero. Also in the illustrated embodiment, the voltage signal 400 includes noise 408 on the logic level one and noise 410 on the logic level zero.

In one embodiment, the noise 408 and 410 may be optical noise and the amplitude of the noise 408 on the logic level one may be greater than the amplitude of the noise 410 on the logic level zero. In the illustrated embodiment, the adjusted threshold voltage value 414 may provide similar BER results for the voltage signal 400 as the threshold voltage value 314 provided for the voltage signal 300.

Referring back to FIG. 2, in a block 212 the differential amplifier 110 may measure the current 128 through the resistor 112 by sensing the voltage across the resistor 112 and the differential amplifier 110 outputs a voltage 132, which may be proportional to the average power in the optical signal 101, to the multiplier 114. In one embodiment, the differential amplifier 110 may amplify the difference between the signals on its non-inverting input and its inverting input.

In a block 214, the multiplier 114 may scale the set point 134 based on the voltage 132. In one embodiment, the multiplier 114 may scale the set point 134 in proportion to the voltage 132 and average power in the optical signal 101 and provide a bipolar voltage 136. For example, the multiplier may multiply the voltage 132 times the set point 134 to obtain the bipolar voltage 136. The bipolar voltage 136 in which zero volts represents fifty percent (50%) of the signal amplitude of the set point 134 may be coupled to the level shifter 116.

In a block 216, the level shifter 116 may shift the DC level of the bipolar voltage 136 to a level appropriate for operation of the decision amplifier 106. In one embodiment, the level shifter may sum the bipolar voltage 136 with a fixed positive voltage (not shown) to provide a level-shifted voltage 138, which may be compatible with the DC operating point of the decision amplifier 106.

In a block 218, the level-shifted voltage 138 and a complementary voltage generated from the level-shifted voltage 138 may be buffered and summed into the differential data path prior to the input of the decision amplifier 106 as a voltage 140. The capacitor 105 may provide alternating current (AC) coupling for the data signal path from the TIA 104.

In a block 220, the decision amplifier 106 may determine a logical one value and a logical zero value based on the voltage 138, which represents the adjusted set point. In one embodiment, the decision amplifier 106 may receive the voltage signal 130 of 1Vpp summed with the level-shifted voltage 138 and using the set point 134 of 25% of the peak-to-peak input voltage the receiver 100 may determine that if the voltage level is −0.25 volts or greater, then the data bit on the incoming optical signal 101 is a logical one. Alternatively, the receiver 100 may determine that if the voltage level is less than −0.25 volts, then the data bit on the incoming optical signal 101 is a logical zero. In another embodiment, the CDR 108 may recover a data clock from the voltage 140 and re-clock data from the decision amplifier 106.

In a block 222, the process 200 finishes.

The operations of the process 200 have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the process 200 is an example process and other processes may be used to implement embodiments of the present invention. A machine-accessible medium with machine-readable data thereon may be used to cause a machine, such as, for example, a processor to perform the method 200.

Figure 5:
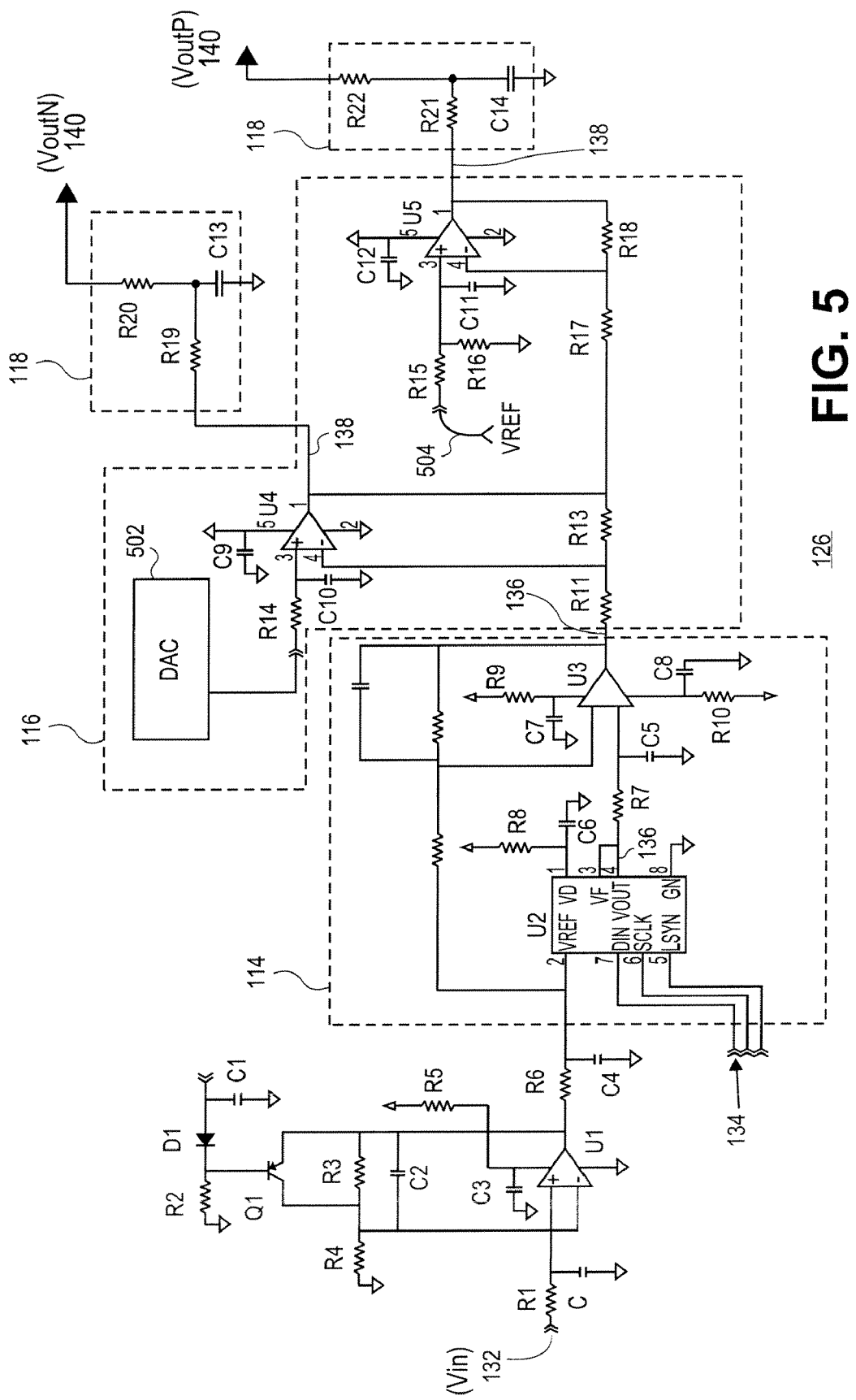
FIG. 5 is a schematic diagram of a decision circuit according to an embodiment of the present invention.

FIG. 5 is a schematic diagram of the decision circuit 126 according to an embodiment of the present invention. In the illustrated embodiment, the decision circuit 126 includes an operational amplifier U1 coupled to the multiplier 114, the multiplier 114 is coupled to the level shifter 116, and the level shifter 116 is coupled to the resistor 118. The example multiplier 114 includes a multiplying DAC U2 and an operational amplifier U3. The example level shifter 116 includes a first operational amplifier U4, a second operational amplifier U5, and an offset DAC 502. The example resistor 118 includes the resistors R19 (100 Ω), R20 (499 Ω), R21 (100 Ω), and R22 (499 Ω). Also in the illustrated embodiment, the input ($V_{in}$) to the operational amplifier U1 is the voltage signal 132 and the outputs ($V_{outP}$ and $V_{outN}$, respectively) of the operational amplifiers U4 and U5 are the voltage 138.

In one embodiment, the illustrated decision circuit 126 operates as follows. $V_{in}$ may be input to amplifier U1 via resistor R1 (4.99KΩ) and amplifier U1 may amplify $V_{in}$. The gain of amplifier U1 may be set at around 2.5. Diode D1 and transistor Q1 and their associated circuitry resistors R2 (20KΩ), R3 (15KΩ), and R4 (10KΩ), and capacitors C1 (1.00 nf) and C2 (270 pf) may clamp the output of amplifier U1 to 2.5 volts. Resistor R5 (20Ω) and capacitor C3 (0.1 μf) may provide filtered biasing for amplifier U1.

In one embodiment, the output of U1 may be coupled to the multiplier U2, which may be a sixteen-bit digital-to-analog converter (DAC), for example, that uses the output of U1 to set the output range of the multiplier U2. The multiplier U2 may multiply the threshold voltage or set point 134 by $V_{in}$. The microcontroller 124 (not shown) may be coupled to the DIN port of the multiplier U2 to provide the multiplier U2 with serial data having the set point 134. In the illustrated embodiment, a signal to synchronize input of the serial data is input on the LSYN pin of the multiplier U2, a clock signal that may clock serial data having the set point 134 into the multiplier U2 is input on the SCLK pin of the multiplier 114, and a VF pin may be a feedback connection for the multiplier U2.

In one embodiment, there may be $2^n$ possible levels for the set point 134. In embodiments in which the multiplier U2 may be a 16-bit DAC, there may be $2^{16}$ or approximately 65K possible levels for the set point 134.

In one embodiment, $V_{in}$ may be applied to the reference port VREF of the multiplier U2 via a resistor R6 (10Ω) and a capacitor C4 (1.00 nf). The output VOUT of the multiplier U2 may be $V_{in}$ scaled by the set point 134. Resistor R8 (20Ω) and capacitor C6 (0.1 µf) may provide filtered biasing for the multiplier U2.

In one embodiment, the output of the multiplier U2 may be coupled to the unipolar to bipolar converter U3 via a resistor R7 (4.99Ω) and a capacitor C5 (100 pf). The unipolar to bipolar converter U3 may convert the unipolar signal from U2 (such as a 0-2.5 volts, for example) to the bipolar signal 136 (such as −2.5 volts to +2.5 volts, for example). Zero volts out of U3 may represent fifty percent (50%) of the threshold range, and −2.5 volts to +2.5 volts may correspond to zero percent (0%) and one hundred percent (100%), respectively, of the threshold range. Resistors R9 (20Ω) and R10 (20Ω), and capacitors C7 (0.1 µf) and C8 (0.1 µf) may provide filtered biasing for the unipolar to bipolar converter U3.

In one embodiment, the unipolar to bipolar converter U3 may drive the signal 136 to the amplifier U4 via the resistor R11 (10KΩ) and amplifier U4 may level shift and boost the current drive of the signal 138 into the decision amplifier 106 (not shown) with the amplifier U4 gain being set by R11 (10KΩ) and R13 (10KΩ). In the illustrated embodiment, the output of the amplifier U4 couples to the amplifier U5, which produces the complementary threshold voltage to drive the complementary input to the decision amplifier 106 (not shown). The amplifier U4 may drive the amplifier U5 via the resistor R17 (10KΩ). The amplifier U5 may invert U4's output to obtain $V_{outP}$ for the differential signal 138 into the tap resistors R19 (100Ω), R20 (499Ω), R21 (100Ω), and R22 (499Ω). In one embodiment, $V_{outP}$ and $V_{outN}$ may be the differential inputs to the decision amplifier 106 (not shown). In one embodiment, capacitors C13 and C14 may be 0.1 µf, each for filtering the threshold voltage.

In the illustrated embodiment, the amplifier U4 includes a second input coupled through the resistor R14 (4.99KΩ). The second input may be a signal from a digital-to-analog converter (DAC) 502, which may generate a voltage to nullify voltage offsets. In one embodiment, the DAC 502 may trim out circuit offsets to obtain a true percentage of the threshold voltage or set point 136. For example, in embodiments in which the threshold voltage or set point 134 may be set to fifty percent (50%), various offsets in the receiver 100 circuits may affect the threshold voltage or set point 136. The DAC 502 output compensates for the offsets to obtain a true percentage of the set point 136. Capacitors C9 (0.1 µf) and C10 (0.1 µf) may provide filtered biasing and a filtered input for the amplifier U2.

In the illustrated embodiment, the amplifier U5 includes a second input coupled through the resistor R15 (4.99KΩ), which may be a signal 504 from a +2.5V voltage reference. Resistor R16 (60.4KΩ) and capacitor C11 (0.1 µf) may provide voltage division and filtering for the amplifier U4 input.

In embodiments of the present invention, the functionality of the decision circuit 126 may be approximated using the following equations:

$$V_{in} = I_{avg} * R_t \quad (1)$$

where $V_{in}$ is the input signal 132 to amplifier U1, $I_{avg}$ is the average current of the photodetector 102, and $R_t$ is the transimpedance of the differential amplifier 110, $$V_{outN} = [V_{offset}*(1+G_2)-V_{in}*G_1*(1-2*D_s)*G_2]*G_3 \quad (2)$$

where $V_{offset}$ is the input to U4 from the offset DAC 502 at resistor R14, $G_2$ is the gain provided by U4, $G_1$ is the gain provided by U1, $D_s$ is a normalized threshold voltage value or set point and may be set by the user anywhere from 0 to 1 to within the resolution of the multiplier U2, for example, and $G_3$ is the gain of the taps R19, R20, R21, and R22 into the decision amplifier 106, and $$V_{outP} = (V_{nom}-V_{outN})*G_3 \quad (3)$$

where $V_{nom}$ is the nominal (midrange) value for $V_{outP}$ and $V_{outN}$ that may be chosen based on the DC operating parameters of the amplifiers U4 and U5 and the decision amplifier 106. $V_{nom}$ is the voltage at U5 pin 3.

Figure 6:
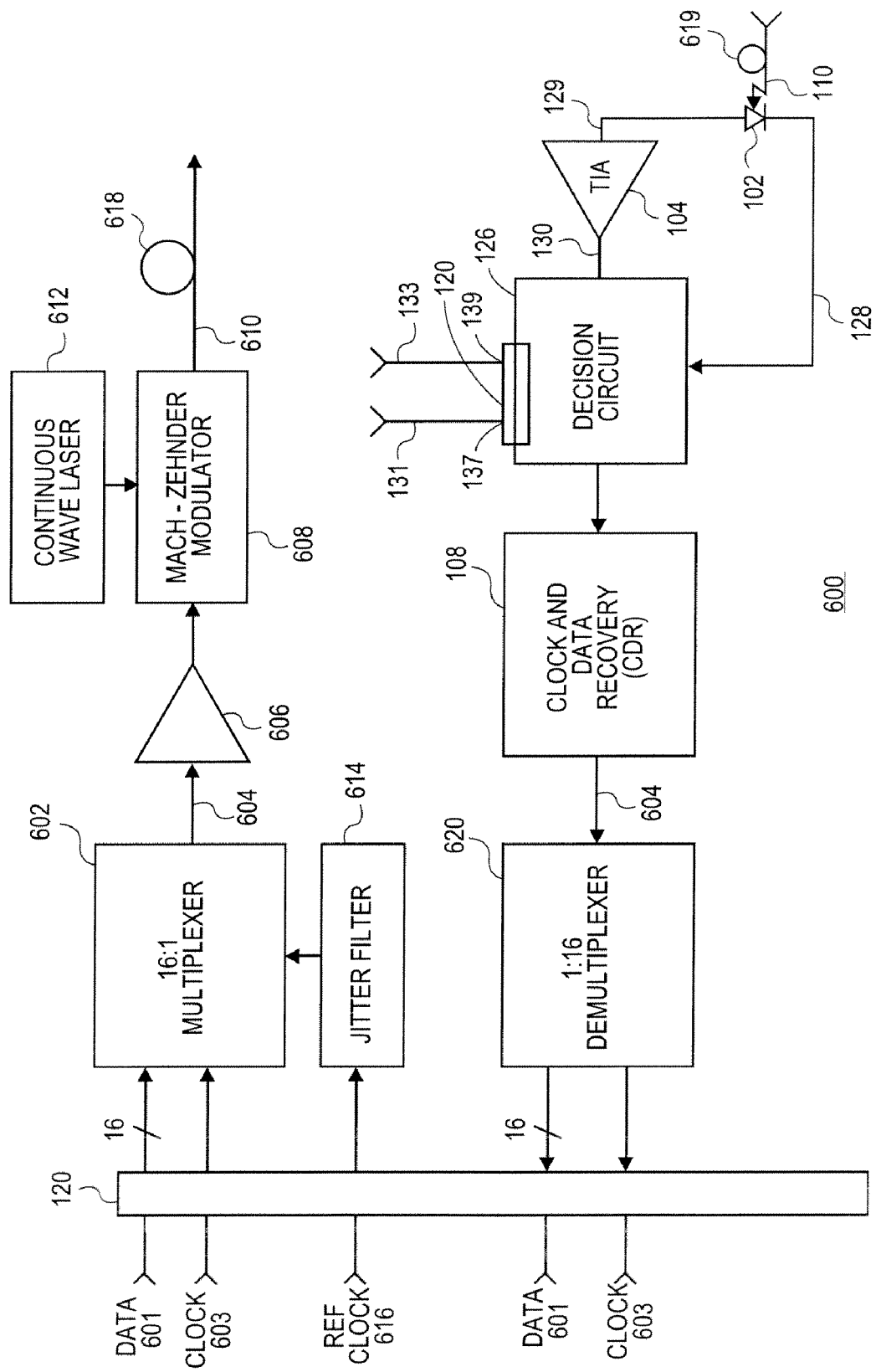
FIG. 6 is a high-level block diagram of a transponder or transceiver according to an embodiment of the present invention.

FIG. 6 is a high-level block diagram of a transponder and/or transceiver 600 according to an embodiment of the present invention. In the illustrated embodiment, data 601, a clock 603 are input to a multiplexer 602 via the connector 120. In one embodiment, the data 601 may be sixteen synchronized data lines and the multiplexer 602 may be a sixteen-to-one multiplexer that may multiplex the sixteen data lines to a ten gigabit per second (10 Gbps) serial data stream 604, which is coupled to a driver 606. In one embodiment, the driver may boost the amplitude of the data stream 604 and a Mach-Zehnder modulator, such as a lithium niobate ($LiNiO_2$) Mach-Zehnder modulator, for example, may convert the amplified serial data stream 604 to an optical signal 610 using light from a continuous wave laser 612, such as a temperature tuned external cavity laser, for example. In the illustrated embodiment, a jitter filter 614 is coupled to the multiplexer 602 and may clean up a reference clock 616 used to clock the data 601 at the 10 Gbps data rate. The optical signal 610 may be launched into an optical fiber 618.

In the illustrated embodiment, an optical fiber 619 receives an optical signal, such as the optical signal 101, and couples it to the photodetector 102 and the TIA 104, whose outputs are coupled to the decision circuit 126. The analog voltage 131 and/or digital representation 133 of the set point may be input to the decision circuit 126 via the connector 120. In the illustrated embodiment, the output of the decision circuit 126, is coupled to the clock and data recovery circuit (CDR) 108, which may recover the serial data stream 604 from the output of 126. A demultiplexer 620 may separate the clock 603 and separate the data 60 into sixteen data lines from the serial data stream 604.

Embodiments of the present invention may be implemented using hardware, software, or a combination thereof. In implementations using software, the software may be stored on a machine-accessible medium.

A machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as recess as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
receiving a value representing a threshold voltage set point for a circuit, the circuit to determine whether a data bit on a first optical signal is a logical one or a logical zero, the threshold voltage set point being based on a first average power of the first optical signal;
receiving second optical signal having a second average power different from the first average power;
adjusting the threshold voltage set point based on the second average power; and
multiplying a voltage that is proportional to the second average power of the second optical signal times the threshold voltage set point to generate a unipolar voltage representing the adjusted threshold voltage set point.

2. The method of claim 1, further comprising generating a photocurrent proportional to the second average power.

3. The method of claim 2, further comprising converting the photocurrent to the voltage proportional to the second average power of the second optical signal.

4. The method of claim 3, further comprising converting the unipolar voltage to a bipolar voltage representing the adjusted threshold voltage set point.

5. The method of claim 4, further comprising:
shifting the direct current level of the bipolar voltage; and
summing in a direct current voltage with the direct current shifted bipolar voltage.

6. An apparatus, comprising:
circuitry to generate a voltage proportional to an average power in an optical signal;
a digital-to-analog converter to multiply the voltage times a set point to obtain a scaled set point, the set point to determine whether a data bit on the optical signal is a logical one or a logical zero;
a first amplifier to decide whether a data bit on the optical signal is a logical one or a logical zero using the scaled set point; and
a second amplifier to convert the scaled set point from a unipolar voltage to a bipolar voltage.

7. The apparatus of claim 6, further comprising a photodetector to receive the optical signal and to convert the optical signal to a photocurrent.

8. The apparatus of claim 7, wherein the photodetector comprises an avalanche photodiode or a positive-intrinsic-negative diode.

9. The apparatus of claim 6, further comprising:
an analog-to-digital converter to convert the set point from an analog value to a digital value; and
a microcontroller to provide the digital set point to the digital-to-analog converter.

10. The apparatus of claim 6, further comprising a transimpedance amplifier to receive a photocurrent from a photodetector and to convert the photocurrent to a voltage proportional to the average power in the optical signal.

11. A method, comprising:
receiving a threshold voltage value to determine whether a data bit on an optical signal is a logical one or a logical zero;
receiving an optical signal;
convening the optical signal to a proportional voltage;
scaling the threshold voltage value in proportion to proportional voltage;
converting the optical signal to proportional current;
summing the proportional current with the scaled threshold voltage value; and
determining whether a data bit on the received optical signal is a logical one or a logical zero using the proportional current summed with the scaled threshold voltage value.

12. The method of claim 11, further comprising shifting a direct current level of the scaled threshold voltage value.

13. The method of claim 11, further comprising receiving a digital threshold voltage value to determine whether a data bit on an optical signal is a logical one or a logical zero.

14. The method of claim 11, further comprising receiving an analog threshold voltage value to determine whether a data bit on an optical signal is a logical one or a logical zero.

* * * * *